United States Patent
Lin

(10) Patent No.: US 12,362,710 B2
(45) Date of Patent: Jul. 15, 2025

(54) ENVELOPE DETECTOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 513 days.

(21) Appl. No.: 18/054,189

(22) Filed: Nov. 10, 2022

(65) Prior Publication Data
US 2024/0162863 A1 May 16, 2024

(51) Int. Cl.
H03F 3/45 (2006.01)
H03F 1/22 (2006.01)
H03F 3/193 (2006.01)

(52) U.S. Cl.
CPC ............ *H03F 1/223* (2013.01); *H03F 3/193* (2013.01); *H03F 2200/102* (2013.01); *H03F 2200/451* (2013.01)

(58) Field of Classification Search
CPC .................................... H03F 3/45; H03F 3/04
USPC .................................. 330/257; 323/315, 316
See application file for complete search history.

(56) References Cited

U.S. PATENT DOCUMENTS
2005/0093629 A1   5/2005   Nishimura et al.

OTHER PUBLICATIONS
TW Office Action dated Apr. 18, 2024 in Taiwan application No. 112128040.

*Primary Examiner* — Henry Choe
(74) *Attorney, Agent, or Firm* — McClure, Qualey & Rodack, LLP

(57) ABSTRACT

A method of envelope detection receives an RF (radio frequency) signal comprising a first voltage and a second voltage; converts the first voltage into a first current using a first VCCS (voltage controlled current source); converts the second voltage into a second current using a second VCCS; converts a bias voltage into a third current using a third VCCS; converting an output voltage into a fourth current using a fourth VCCS; sums the first current and the second current into an input current flowing through a first internal node of a first internal voltage; sums the third current and the fourth current into a mirrored current flowing through a second internal node of a second internal voltage; uses a source follower to receive the second internal voltage and output the output voltage; and uses a current mirror to force the mirrored current to be equal to the input current.

20 Claims, 4 Drawing Sheets

ENVELOPE DETECTOR AND METHOD THEREOF

BACKGROUND OF THE DISCLOSURE

Field of the Disclosure

The present invention generally relates to an envelope detector, and more particularly relates to low distortion envelope detectors and related methods.

Description of Related Art

An RF (radio frequency) signal S(t) can be mathematically modeled by the following equation:

$$S(t)=A(t)\cdot\sin(2\pi f_C t+\varphi(t)) \quad (1)$$

Here, t is a time variable, A(t) is an envelope signal, $f_C$ is a carrier frequency, and $\varphi(t)$ is a phase signal. The envelope signal and the phase signal can be used to carry information. The information embedded in the envelope signal can be retrieved using an envelope detector. As shown in FIG. 1, a prior art envelope detector 100 receives an RF signal and outputs an envelope signal in accordance with a DC (direct current) bias voltage. Such a system comprises: a diode 101, two capacitors 102 and 104, and two resistors 103 and 105. Envelope detectors 100 are well known in the prior art and thus not explained herein in detail. Note that capacitor 104, which provides AC (alternate current) coupling, and resistor 105, which establishes a DC value for the RF signal after the AC coupling, are not needed if the RF signal already has a proper DC value. A drawback of the envelope detector 100 is distortion, which is due to a threshold voltage and crossover characteristics of the diode 101. Although the issue can be alleviated by properly choosing a value for the DC bias voltage, the value might be highly dependent on temperature and manufacturing process, and the improvement is limited due to the inherent crossover characteristics of the diode 101.

What is desired is an envelope detector that can have low distortion and good immunity to temperature and manufacturing process variations.

BRIEF DESCRIPTION OF THIS DISCLOSURE

An objective of this invention is to alleviate temperature and manufacturing process dependency of an envelope detector.

Another objective of this invention is to alleviate a crossover distortion of an envelope detector.

In an embodiment, an envelope detector comprises: a first VCCS (voltage controlled current source) configured to output a first current to a first internal node of a first internal voltage in accordance with a first voltage of an RF (radio frequency) signal; a second VCCS configured to output a second current to the first internal node in accordance with a second voltage of the RF signal; a third VCCS configured to output a third current to a second internal node of a second internal voltage in accordance with a first bias voltage; a fourth VCCS configured to output a fourth current to the second internal node in accordance with an output voltage; a source follower configured to receive the second internal voltage and output the output voltage; and a current mirror configured to force a sum of the third current and the fourth current at the second internal node to be equal to a sum of the first current and the second current at the first internal node.

In an embodiment, a method of envelope detection comprises: receiving an RF (radio frequency) signal comprising a first voltage and a second voltage; converting the first voltage into a first current using a first VCCS (voltage controlled current source); converting the second voltage into a second current using a second VCCS; converting a bias voltage into a third current using a third VCCS; converting an output voltage into a fourth current using a fourth VCCS; summing the first current and the second current into an input current flowing through a first internal node of a first internal voltage; summing the third current and the fourth current into a mirrored current flowing through a second internal node of a second internal voltage; using a source follower to receive the second internal voltage and output the output voltage; and using a current mirror to force the mirrored current to be equal to the input current.

DETAILED DESCRIPTION OF THIS DISCLOSURE

Figure 1:
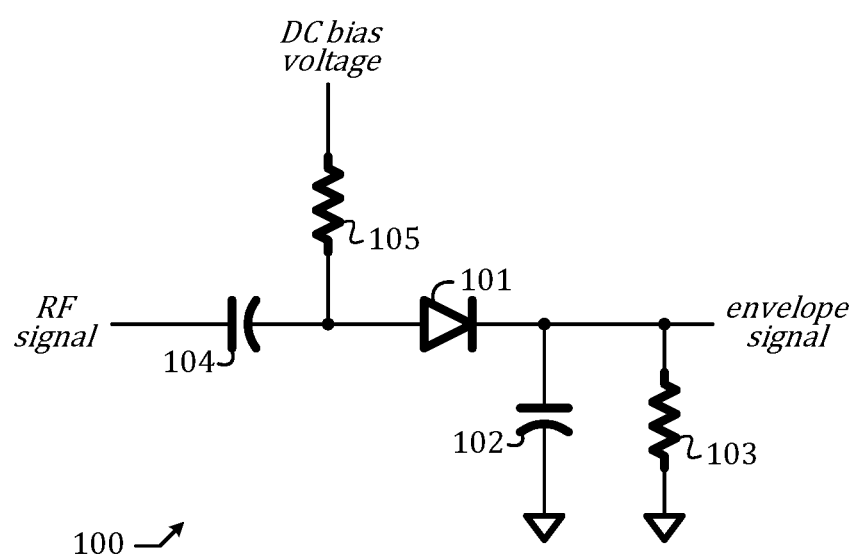
FIG. 1 shows a schematic diagram of a prior art envelope detector.

The present disclosure is directed to envelope detection. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "circuit node," "signal," "power supply," "ground," "bias voltage," "DC (direct current)," "AC (alternate current)," "NMOSFET (n-channel metal oxide semiconductor field effect transistor)," "PMOSFET (p-channel metal oxide semiconductor field effect transistor)," "current mirror," "current source," "common-source amplifier," "cascode," and "impedance." Terms like these are used in a context of microelectronics, and the associated concepts are apparent to those of ordinary skills in the art and thus will not be explained in detail in this disclosure.

Those of ordinary skill in the art will recognize a resistor symbol, a capacitor symbol, and a MOSFET (metal-oxide semiconductor field effect transistor) symbol, for both PMOSFET and NMOSFET, and can identify a "source" terminal, a "gate" terminal, and a "drain" terminal of a MOSFET. Those of ordinary skills in the art can read schematics of a circuit comprising resistors, capacitors, NMOSFET, and PMOSFET, and do not need a verbose description about how one transistor, resistor, or capacitor connects with another in the schematics.

This present disclosure is disclosed in terms of an engineering sense. For instance, regarding two variables X and Y, when it is said that "X is equal to Y," it means that "X is approximately equal to Y," i.e., "a difference between X and Y is smaller than a specified engineering tolerance." When it is said that "X is zero," it means that "X is approximately zero," i.e., "X is smaller than a specified engineering tolerance." When it is said that "X is substantially smaller than Y," it means that "X is negligible with respect to Y," i.e., "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero.

A circuit is a collection of a transistor, a capacitor, a resistor, and/or other electronic devices inter-connected in a certain manner to embody a certain function.

A network is a circuit or a collection of circuits configured to embody a certain function.

In this present disclosure, a "circuit node" is simply referred to as a "node" for short, as the meaning is clear from a context of microelectronics won't cause confusion.

In this present disclosure, a signal is a voltage of a variable level that can vary with time. A (voltage) level of a signal at a moment represents a state of the signal at that moment. A differential signal, or a signal in a differential embodiment, comprises a first voltage and a second voltage, and a difference in level between the first voltage and the second voltage represents a state of the differential signal.

Figure 2:
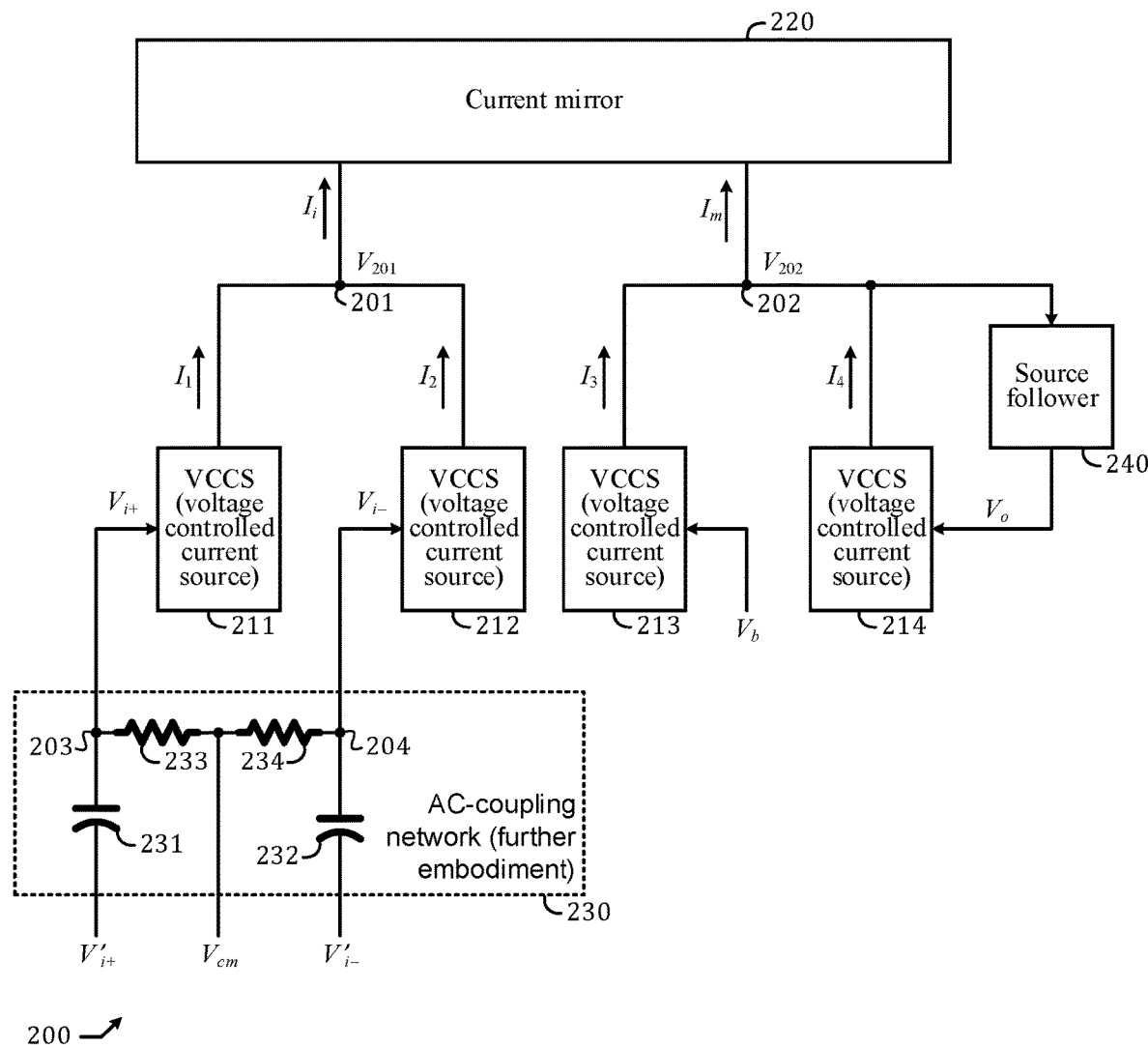
FIG. 2 shows a schematic diagram of an envelope detector in accordance with an embodiment of the present disclosure.

A schematic diagram of an envelope detector 200 in accordance with an embodiment of the present disclosure is shown in FIG. 2. Envelope detector 200 receives an input signal, which is an RF signal and in a differential embodiment comprises two voltages $V_{i+}$ and $V_{i-}$, and outputs an output voltage $V_o$, which is a detected envelope signal of the input signal. Envelope detector 200 comprises: a first VCCS (voltage controlled current source) 211 configured to receive $V_{i+}$ and outputs a first current $I_1$ to a first internal node 201 of a first internal voltage $V_{201}$; a second VCCS 212 configured to receive $V_{i-}$ and outputs a second current $I_2$ to the first internal node 201; a third VCCS 213 configured to receive a bias voltage $V_b$ and output a third current $I_3$ to a second internal node 202 of a second internal voltage $V_{202}$; a fourth VCCS 214 configured to receive an output voltage $V_o$ and output a fourth current $I_4$ to the second internal node 202; a current mirror 220 configured to mirror an input current $I_i$ (which is a sum of $I_1$ and $I_2$ at the first internal node 201) into a mirrored current $I_m$ (which is a sum of $I_3$ and $I_4$ at the second internal node 202); and a source follower 240 configured to receive $V_{202}$ and output $V_o$.

$V_{i+}$ and $V_{i-}$ jointly embody an RF signal. In an embodiment, $V_{i+}$ and $V_{i-}$ are complementary, i.e., when $V_{i+}$ rises/falls by an amount, $V_{i-}$ will fall/rise by the same account. When $V_{i+}$ reaches a peak, $V_{i-}$ will reach a valley, and vice versa. An envelope of the RF signal is defined by a peak of $V_{i+}$ or a peak of $V_{i-}$, whichever is higher.

Figure 3:
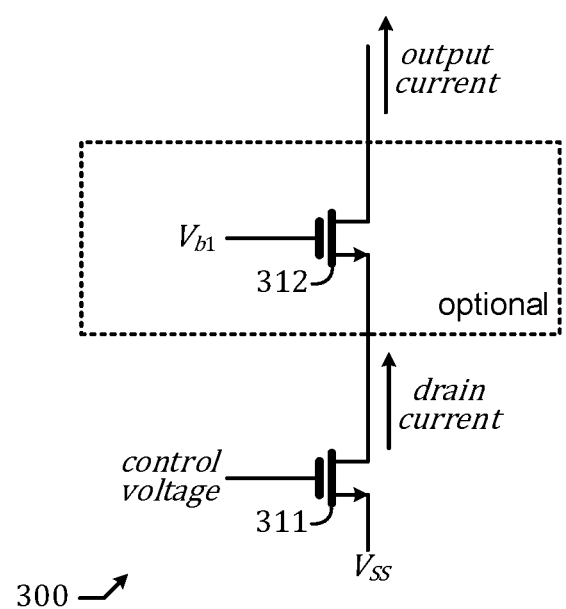
FIG. 3 shows a schematic diagram of a voltage control current source that can be instantiated to be used in the envelope detector of FIG. 2.

A VCCS (voltage controlled current source) is a voltage-to-current conversion circuit configured to output an output current in accordance with a control voltage. A schematic diagram of a VCCS 300 that can be instantiated to embody VCCS 211, 212, 213, and 214 is shown in FIG. 3. VCCS 300 comprises: a first NMOSFET (n-channel metal oxide semiconductor field-effect transistor) 311 and second NMOSFET 312. NMOSFET 311 is configured to be a common-source amplifier that receives a control voltage at its gate and outputs a drain current via its drain, while its source is connected to a ground node $V_{SS}$. NMOSFET 312 is configured to be a common-gate amplifier that receives the drain current from its source and outputs an output current via its drain in accordance with a bias voltage $V_{b1}$ provided at its gate. NMOSFET 312 is also known as a cascode device that is used to boost an output impedance of VCCS 300. However, NMOSFET 312 is optional; in other words, a function of VCCS 300 is still preserved if NMOSFET 312 were removed and the drain current becomes the output current. VCCS 300 along with the concepts of common-source amplifier, common-gate amplifier, cascode device, and output impedance boosting are well understood by those of ordinary skill in the art and thus not described in detail here. When VCCS 300 is used to embody VCCS 211 (212, 213, 214), the control voltage refers to $V_{i+}$ ($V_{i-}$, $V_b$, $V_o$) and the output current refers to $I_1$ ($I_2$, $I_3$, $I_4$).

Figure 4:
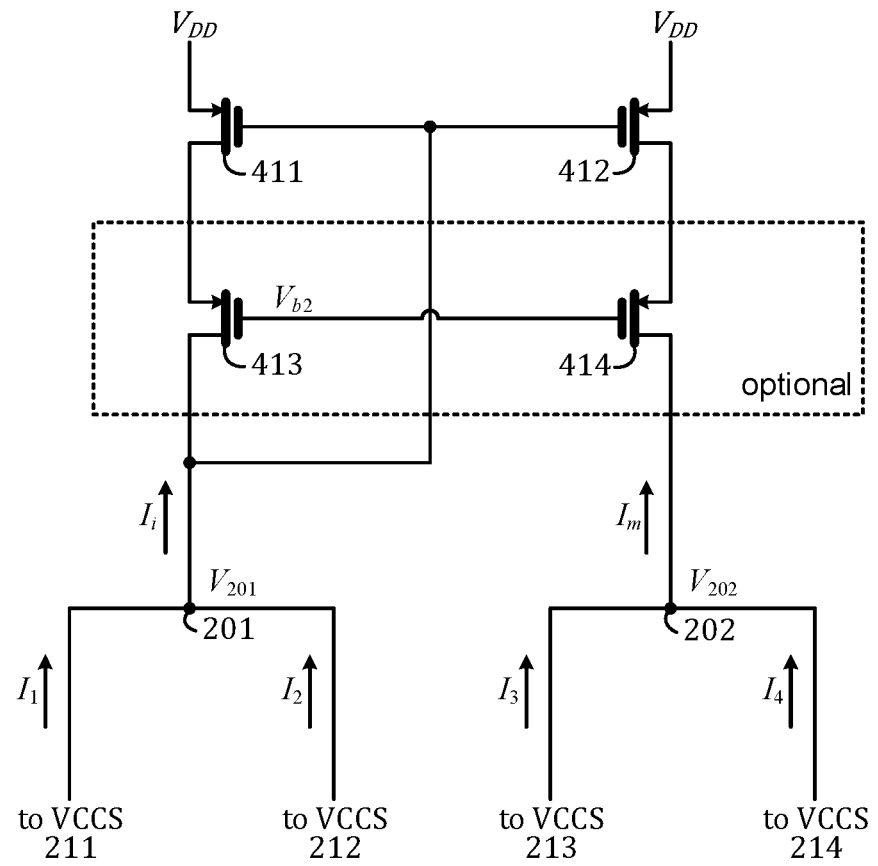
FIG. 4 shows a schematic diagram of a current mirror that can be used in the envelope detector of FIG. 2.

A schematic diagram of a current mirror 400 that can be used to embody current mirror 220 is shown in FIG. 4. Current mirror 400 comprises four NMOSFET 411, 412, 413, and 414. NMOSFET 411 and 412, which are identical, are configured as a pair of common-source amplifiers that share the same gate voltage of $V_{201}$ and the same source voltage of the power node $V_{DD}$, while NMOSFET 413 and 414, which are identical, are configured as a pair of cascode devices that share the same gate voltage of a bias voltage $V_{b2}$. Current mirror 400, a function of which is to make the mirrored current $I_m$ substantially equal to the input current $I_i$, is widely used in the prior art and well understood by those of ordinary skill in the art and thus not explained in detail. NMOSFET 413 and 414, which are used to boost an output impedance of the current mirror 400, are optional and can be removed without nullifying a current mirroring function.

Figure 5:
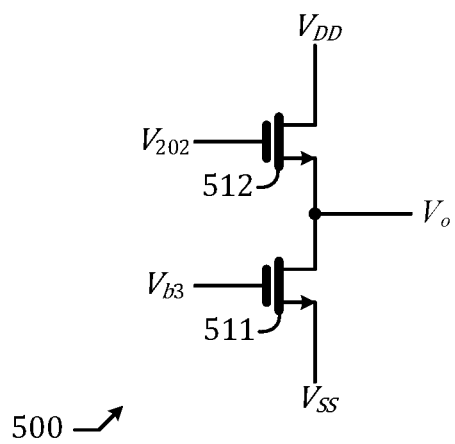
FIG. 5 shows a schematic diagram of a source follower that can be used in the envelope detector of FIG. 2.

A schematic diagram of a source follower 500 that can be used to embody source follower 240 is shown in FIG. 5. Source follower 500 comprises two NMOSFET 511 and 512. NMOSFET 512 is configured as a common-drain amplifier that receives $V_{202}$ and output $V_o$, while NMOSFET 511 is configured as a current source that provides a bias current for NMOSFET 512 in accordance with a bias voltage $V_{b3}$. Current source is widely used in the prior art and well understood by those of ordinary skill in the art and thus not described in detail here.

Now, refer to FIG. 2. A DC (direct current) value of $V_{i+}$ is equal to a common-mode voltage $V_{cm}$, so is a DC value of $V_{i-}$. In an embodiment, the common-mode voltage $V_{cm}$ is equal to the bias voltage $V_b$. In a further embodiment, the envelope detector 200 further comprises an AC (alternate current) coupling network 230 configured to couple two voltages $V'_{i+}$ and $V'_{i-}$ into $V_{i+}$ and $V_{i-}$, respectively, wherein $V'_{i+}$ and $V'_{i-}$ jointly embody an incoming signal in a differential embodiment. AC coupling network 230 comprising two capacitors 231 and 232 configured to provide AC (alternate current) coupling from $V'_{i+}$ and $V'_{i-}$ to $V_{i+}$ and $V_{i-}$, respectively, and resistors 233 and 234 are configured to provide DC (direct current) coupling from the common-mode voltage $V_{cm}$ to $V_{i+}$ and $V_{i-}$, respectively. In an embodiment, a capacitance of capacitors 231 and 232 is substantially greater than a parasitic capacitance (not shown in figure but the concept is well understood by those of ordinary skill in the art) at nodes 203 and 204; this way, the AC coupling function of capacitors 231 and 232 can be effective. In an embodiment, a resistance of resistors 233 and 234 is substantially larger than an impedance of capacitors 231 and 232 at a frequency of the incoming signal; this way, resistors 233 and 234 can make a DC value of $V_{i+}$ and $V_{i-}$ be equal to $V_{cm}$ without introducing an appreciable AC signal loss of the incoming signal, and consequently an amplitude of $V'_{i+}$ can be approximately equal to an amplitude of $V_{i+}$, while an amplitude of $V_{i-}$ can be approximately equal to an amplitude of $V'_{i-}$.

Envelope detector 200 offers some advantages over the prior art envelope detector 100. First, it is highly insensitive to temperature and manufacturing process variations. When temperature and manufacturing process vary, characteristics of VCCS 211, 212, 213, and 214 will vary accordingly. However, current mirror 220 will enforce the condition that a sum of $I_1$ and $I_2$ be equal to a sum of $I_3$ and $I_4$, regardless of the variation of temperature and/or manufacturing process. Given that VCCS 211, 212, 213, and 214 are instantiated from the same circuit, their voltage-to-current transfer characteristics vary in the same way and track one another. Therefore, the transfer characteristics from $V_{i+}$ and $V_{i-}$ to $V_o$ remain the same regardless of the variation of temperature and/or manufacturing process. Second, crossover distortion can be alleviated. Although VCCS 211, 212, 213, and 214 all exhibit crossover distortions in voltage-to-current conversion, they all distort in the same way and track one another. Therefore, the distortions are substantially tracked, cancelled, and nearly disappear in the transfer characteristics from $V_{i+}$ and $V_{i-}$ to $V_o$.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An envelope detector comprising:
a first VCCS (voltage controlled current source) configured to output a first current to a first internal node of a first internal voltage in accordance with a first voltage of an RF (radio frequency) signal;
a second VCCS configured to output a second current to the first internal node in accordance with a second voltage of the RF signal;
a third VCCS configured to output a third current to a second internal node of a second internal voltage in accordance with a first bias voltage;
a fourth VCCS configured to output a fourth current to the second internal node in accordance with an output voltage;
a source follower configured to receive the second internal voltage and output the output voltage; and
a current mirror configured to force a sum of the third current and the fourth current at the second internal node to be equal to a sum of the first current and the second current at the first internal node.

2. The envelope detector of claim 1, wherein each of the first VCCS, the second VCCS, the third VCCS, and the fourth VCCS is instantiated from a voltage-to-current conversion circuit that comprises a common-source amplifier that receives a control voltage and outputs an output current.

3. The envelope detector of claim 2, wherein the voltage-to-current conversion circuit further comprise a cascode device controlled by a second bias voltage and configured to boost an output impedance.

4. The envelope detector of claim 1, wherein the current mirror comprises two common-source amplifiers controlled by the first internal voltage.

5. The envelope detector of claim 4, wherein the current mirror further comprises a cascode device controlled by a second bias voltage to boost an output impedance.

6. The envelope detector of claim 1, wherein a DC (direct current) value of the first voltage and a DC value of the second voltage are both equal to a common-mode voltage.

7. The envelope detector of claim 6, wherein the common-mode voltage is equal to the first bias voltage.

8. The envelope detector of claim 1 further comprising an AC (alternate current) coupling network configured to couple a third voltage and a fourth voltage to the first voltage and the second voltage, respectively, wherein the third voltage and the fourth voltage jointly embody an incoming signal in differential embodiment.

9. The envelope detector of claim 8, wherein the AC coupling network comprises two capacitors configured to provide AC coupling from the third voltage and the fourth voltage to the first voltage and the second voltage, respectively, and two resistors configured to provide DC (direct current) coupling from a common-mode voltage to the first voltage and the second voltage, respectively.

10. The envelope detector of claim 9, wherein a resistance of the two resistors is substantially greater than an impedance of the two capacitors at a frequency of interest of the incoming signal.

11. A method of envelope detection comprising:
receiving an RF (radio frequency) signal comprising a first voltage and a second voltage; converting the first voltage into a first current using a first VCCS (voltage controlled current source);
converting the second voltage into a second current using a second VCCS;
converting a first bias voltage into a third current using a third VCCS;
converting an output voltage into a fourth current using a fourth VCCS;
summing the first current and the second current into an input current flowing through a first internal node of a first internal voltage;
summing the third current and the fourth current into a mirrored current flowing through a second internal node of a second internal voltage;
using a source follower to receive the second internal voltage and output the output voltage; and
using a current mirror to force the mirrored current to be equal to the input current.

12. The method of envelope detection of claim 11, wherein each of the first VCCS, the second VCCS, the third VCCS, and the fourth VCCS is instantiated from a voltage-to-current conversion circuit that comprises a common-source amplifier that receives a control voltage and outputs an output current.

13. The method of envelope detection of claim 12, wherein the voltage-to-current conversion circuit further comprise a cascode device controlled by a second bias voltage and configured to boost an output impedance.

14. The method of envelope detection of claim 11, wherein the current mirror comprises two common-source amplifiers controlled by the first internal voltage.

15. The method of envelope detection of claim 14, wherein the current mirror further comprises a cascode device controlled by a second bias voltage and configured to boost an output impedance.

16. The method of envelope detection of claim 11, wherein a DC (direct current) value of the first voltage and a DC value of the second voltage are both equal to a common-mode voltage.

17. The method of envelope detection of claim 16, wherein the common-mode voltage is equal to the first bias voltage.

18. The method of envelope detection of claim 11 further comprising an AC (alternate current) coupling network configured to couple a third voltage and a fourth voltage to the first voltage and the second voltage, respectively, wherein the third voltage and the fourth voltage jointly embody an incoming signal in differential embodiment.

19. The method of envelope detection of claim 18, wherein the AC coupling network comprises two capacitors configured to provide AC coupling from the third voltage and the fourth voltage to the first voltage and the second voltage, respectively, and two resistors configured to provide DC (direct current) coupling from a common-mode voltage to the first voltage and the second voltage, respectively.

20. The method of envelope detection of claim 19, wherein a resistance of the two resistors is substantially greater than an impedance of the two capacitors at a frequency of interest of the incoming signal.

\* \* \* \* \*